(12) United States Patent
Brown, Jr. et al.

(10) Patent No.: US 8,000,068 B2
(45) Date of Patent: Aug. 16, 2011

(54) ESD PROTECTION FOR FIELD EFFECT TRANSISTORS OF ANALOG INPUT CIRCUITS

(75) Inventors: Gary Lee Brown, Jr., Oceanside, CA (US); Alberto Cicalini, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 227 days.

(21) Appl. No.: 12/259,158

(22) Filed: Oct. 27, 2008

(65) Prior Publication Data
US 2010/0103571 A1    Apr. 29, 2010

(51) Int. Cl.
*H02H 9/00*   (2006.01)
*H01C 7/12*   (2006.01)
*H02H 1/00*   (2006.01)
*H02H 1/04*   (2006.01)
*H02H 3/22*   (2006.01)
*H02H 9/06*   (2006.01)

(52) U.S. Cl. .......................... 361/56; 361/118
(58) Field of Classification Search .............. 361/56
See application file for complete search history.

(56) References Cited

U.S. PATENT DOCUMENTS

| | | | |
|---|---|---|---|
| 6,501,632 B1 * | 12/2002 | Avery et al. ................... | 361/111 |
| 7,110,228 B2 | 9/2006 | Chang | |
| 7,649,722 B2 | 1/2010 | Thijs et al. | |
| 2004/0190209 A1 | 9/2004 | Jozwiak et al. | |

FOREIGN PATENT DOCUMENTS

| | | |
|---|---|---|
| EP | 0623958 A1 | 11/1994 |
| EP | 0736904 A1 | 10/1996 |

OTHER PUBLICATIONS

International Search Report and Written Opinion—PCT/US2009/062254, International Search Authority—European Patent Office—Feb. 9, 2010.

* cited by examiner

Primary Examiner — Dharti H Patel
(74) Attorney, Agent, or Firm — Jonathan T. Velasco

(57) ABSTRACT

During an ESD event, an ESD current flows from a ground node of a first ESD protection circuit and out of an integrated circuit to a terminal of a package that houses the integrated circuit. To improve ESD performance, a second ESD protection circuit is provided. A diode of the second ESD protection circuit is coupled between the ground node and the body of an input transistor of a Low Noise Amplifier (LNA). If the voltage on the ground node changes quickly during an ESD event (for example, due to a current spike flowing across a wire bond), then the diode charges the body of the transistor, thereby preventing a large gate-to-body voltage from developing across transistor. In some embodiments, another ground bond pad is provided and the second ESD protection circuit includes other diodes that charge or discharge other nodes during the ESD event to prevent transistor damage.

18 Claims, 6 Drawing Sheets

SECOND EMBODIMENT

FIRST EMBODIMENT

FIRST EMBODIMENT

SECOND EMBODIMENT

SECOND EMBODIMENT

THIRD EMBODIMENT

ESD PROTECTION FOR FIELD EFFECT TRANSISTORS OF ANALOG INPUT CIRCUITS

TECHNICAL FIELD

The disclosed embodiments relate to electrostatic discharge (ESD) protection structures and methods.

BACKGROUND

Integrated circuits can be damaged by high voltage spikes produced by electrostatic discharge (ESD). High static charges can develop on objects such as a human body. Consider a situation in which a packaged integrated circuit is free and is not coupled to a printed circuit. Power and ground conductors within the integrated circuit may be resting at a first potential. If a person were charged with a static charge, and then were to touch a terminal of the integrated circuit, the high static voltage charge on body of the person might be discharged quickly through the terminal and into the integrated circuit until the integrated circuit and the human body equalize at a common potential. Such an electrostatic discharge event may momentarily introduce high local voltages and high currents into the integrated circuit. These momentary high voltages and currents may permanently damage the integrated circuit. Damage from an ESD event may occur both during integrated circuit manufacture or may occur later during use of an electronic consumer device that incorporates the integrated circuit.

To prevent ESD events from damaging integrated circuits, circuits called electrostatic discharge (ESD) protection devices are commonly incorporated into integrated circuits. An ESD protection circuit has circuitry that is able to shunt the momentary high currents of an ESD discharge event, thereby preventing a high voltage from developing across a transistor or other easily damaged component of the integrated circuit. One type of integrated circuit that should be protected from ESD event damage is an integrated circuit that involves a sensitive analog amplifier circuit referred to as a Low Noise Amplifier (LNA). This type of integrated circuit involving an LNA is typically found in cellular telephones. In the LNA, the gate of a field effect transistor is typically coupled directly or through a capacitor to bond pad or microbump of the integrated circuit. This bond pad or microbump is coupled to circuitry outside the integrated circuit via an integrated circuit package that houses the integrated circuit. ESD protection circuits have worked well in protecting the gate of this field effect transistor in the past, but more recently as the size of the integrated circuits that include such LNA circuits has increased, the input field effect transistors of LNA circuits have been seen to fail due to ESD damage. An improved LNA input circuit is desired.

SUMMARY

During an ESD event, an ESD current flows from a ground node of a first ESD protection circuit and out of an integrated circuit to a terminal of a package that houses the integrated circuit. The first ESD protection circuit may be a conventional ESD protection circuit involving a pair of diodes and a clamp. To improve ESD performance, a second ESD protection circuit is provided. In one example, the second ESD protection circuit includes a diode coupled between the ground node and the body of an input transistor of a source degenerated Low Noise Amplifier (LNA). The diode allows a rapid charging/discharging of the P-type well of the body of the transistor during an ESD event without having the charge/discharge current flow through a large inductance, such as bond wire inductance.

In one example, if the voltage on the ground node of the first ESD protection circuit increases during an ESD event (for example, due to a current spike flowing across the inductance of a wire bond coupled to the ground node), then the diode of the second ESD protection circuit becomes forward biased and charges the body of the transistor. The body in one specific embodiment is a P-type well into which the N-type drain and source regions of the N-channel transistor extend. This charging of the body of the N-channel transistor causes the voltage on the body of the transistor to rise and track the increase in the voltage on the ground node of the first ESD protection circuit. This voltage rise and tracking of the body voltage prevents a large gate-to-body voltage from developing across the transistor. If, on the other hand, the voltage on the ground node spikes downward during an ESD event (for example, due to a current spike of the opposite polarity flowing across the inductance of a bond wire coupled to the ground node), then the body of the transistor is discharged by a current path extending through an inherent PN body-to-source junction of the transistor, and from the source of the transistor through a degeneration inductor of the LNA to a ground node of the LNA. The discharging of the transistor body helps reduce the voltage on the body so that a large voltage does not develop across the gate dielectric of the transistor.

In a second embodiment, the ground node of the first ESD protection circuit is provided with a ground bond pad that is different from the ground bond pad that grounds the LNA circuit. The body of the transistor is coupled on the integrated circuit to the ground bond pad that grounds the LNA circuit. The second ESD protection circuit includes a pair of back-to-back connected diodes connected between the two ground bond pads. In an ESD event, the two back-to-back connected diodes prevent the voltage on the body of the transistor from being more than approximately one forward bias diode voltage drop away from the voltage on the ground bond pad of the first ESD protection circuit. Because the voltage on the gate of the transistor is close to the same voltage as the voltage on the ground bond pad of the first ESD protection circuit, the back-to-back connected diodes prevent a large voltage from developing between the body of the transistor and the gate of the transistor. The inherent PN body-to-source junction of the transistor prevents the voltage on the source from falling more than one forward bias diode drop below the voltage on the body of the transistor. Due to the action of the second ESD protection circuit and the inherent PN junction, large and damaging gate-to-body and gate-to-source voltages that might otherwise occur during ESD events are prevented.

In a third embodiment, a third ground bond pad is provided and this third ground bond pad is coupled to the body of the transistor. The second ground bond pad through which the degeneration inductor of the LNA is grounded is therefore isolated from the third ground bond pad through which the body of the transistor is grounded. Substrate noise that may be present on the third bond pad can therefore be isolated from the second bond pad. Transistor operation is more effectively isolated from the substrate noise. The second ground bond pad through which the source of the degenerated transistor of the LNA is grounded is also isolated from the first ground pad that grounds the first ESD protection circuit. Transistor operation is more effectively isolated from noise on the ground node of the first ESD protection circuit. In the third embodiment, the second ESD protection circuit two pairs of back-to-back connected diodes. The first pair of back-to-back connected diodes is connected between the first ground bond pad and the third ground bond pad. This first pair of diodes prevents the voltage of the third ground bond pad from differing by more than one forward bias diode voltage drop from the voltage on the first bond pad. The second pair of back-to-back connected diodes is connected between the first ground bond pad and the second ground bond pad. This second pair of diodes prevents the voltage of the second ground bond pad from differing by more than one forward bias diode voltage drop from the voltage on the first ground bond pad. Accordingly, the voltages of both the second and third ground bond pads are prevented from differing by more than approximately one forward bias diode voltage drop from the voltage on the first ground bond pad during an ESD event. This helps prevent large gate-to-source and gate-to-body voltages from developing in an ESD event and damaging the transistor of the LNA.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
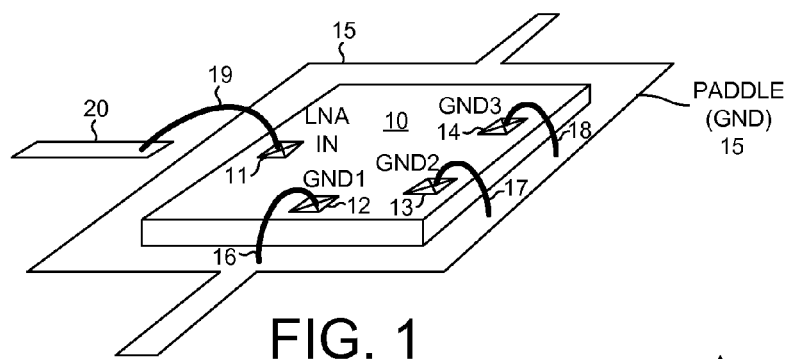
FIG. 1 is a simplified perspective diagram of an integrated circuit die 10 of a packaged integrated circuit.

FIG. 1 is a simplified perspective diagram of an integrated circuit die 10 of a packaged integrated circuit referred to as a micro-QFN package. The letters QFN stand for Quad, Flat, No-Lead. In this example, most of the package that contains integrated circuit die 10 is not illustrated. This package includes an amount of injection molded encapsulant epoxy material that covers the integrated circuit die. In FIG. 1, the epoxy encapsulant is not shown so that the integrated circuit die 10 within the package can be seen. The upper active side of integrated circuit die 10 includes many bond pads including the four bond pads 11-14 seen in FIG. 1. Only four bond pads are illustrated in FIG. 1 in order to simplify the illustration. Each bond pad is coupled by a corresponding bond wire to another part of the package. Integrated circuit die 10 is disposed on a plate 15 of metal referred to as the "paddle". Ground bond pads 12-14 are coupled by bond wires 16-18 down to this paddle 15. The fourth bond pad 11 in FIG. 1 is a bond pad through which an analog circuit referred to as a Low Noise Amplifier (LNA) receives an input signal from a source outside the integrated circuit package. This LNA IN bond pad 11 is coupled by a bond wire 19 to a terminal 20 of the package.

Figure 2:
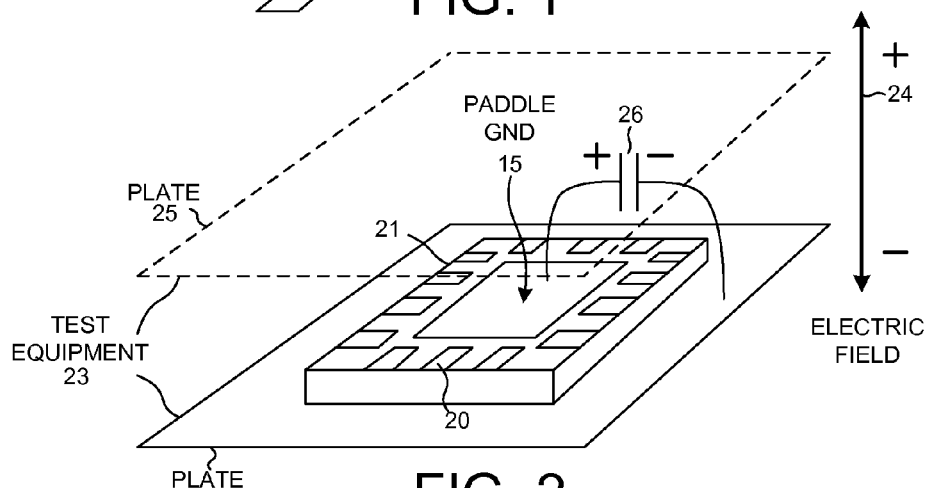
FIG. 2 is a diagram that illustrates one type of ESD test that may be performed on the packaged integrated circuit 21 of FIG. 1.

FIG. 2 is a diagram that illustrates one type of ESD test that may be performed on the integrated circuit to confirm that integrated circuits of the same construction as the tested one will function adequately and will be able to withstand ESD events of particular magnitudes. This test is sometimes referred to as a Charge Device Model (CDM) test. The packaged integrated circuit 21 is placed upside down on a plate 22 of a piece of ESD test equipment 23. In the perspective seen in FIG. 2, the paddle ground 15 is seen exposed in the center of the bottom side (facing upward in the illustration) of the package. A ring of terminals is seen surrounding the paddle ground 15. One of these terminals is the LNA IN terminal 20 of FIG. 1.

During the ESD test, a high magnitude electric field 24 is created between plate 22 and another plate 25 of the test equipment. The packaged integrated circuit 21 is disposed between plates 22 and 25 in the electric field. The electric field 24 induces a voltage onto conductors of the packaged integrated circuit 21 as compared to the voltage on the plate 22 of the test equipment. The capacitor symbol 26 in FIG. 2 represents two plates of a charged capacitor. A first plate of this capacitor 26 represents combined metallization within the packaged integrated circuit 21. A second plate of this capacitor 26 is the plate 22 of the test equipment. Capacitor 26 does not exist as an actual discrete structure. The representation of capacitor 26 is introduced here to help explain the induced charging of the packaged integrated circuit 21. Due to the powerful electric field 24, a voltage of approximately 750 volts is induced across capacitor 26.

Figure 3:
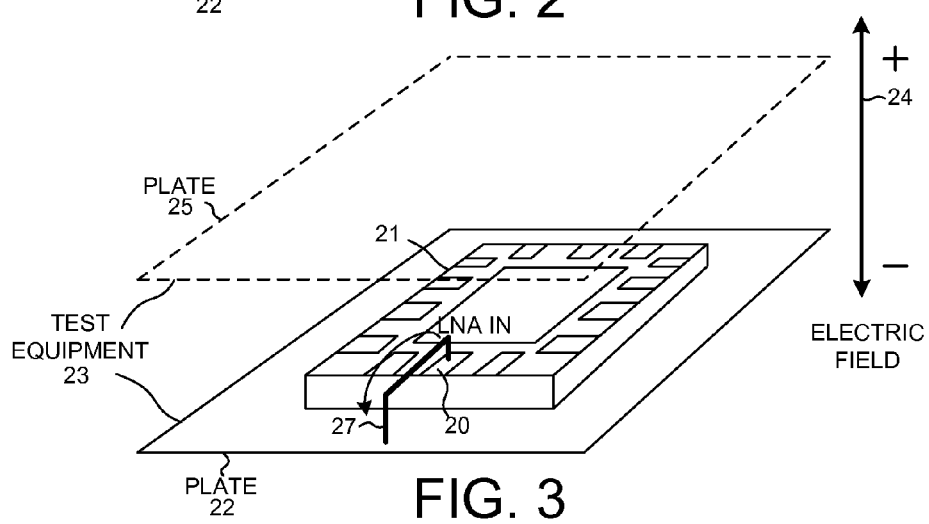
FIG. 3 is perspective view that illustrates a subsequent step in the ESD test in which a terminal of the integrated circuit package is shorted to plate 22 of the test equipment.

FIG. 3 illustrates a next step in the ESD test. Once capacitor 26 is charged, a probe 27 of the test equipment is made to contact a terminal of the integrated circuit package and to short the terminal to plate 22. In the example of terminal 20, the charged capacitance 26 is discharged through probe 27 to plate 22 in what is called a "discharge event". After the discharge event, the probe 27 is removed, the polarity of the electric field 24 is reversed, and the test is repeated. Each terminal of the packaged integrated circuit is tested in this fashion. After the test discharging of the terminals, operation of integrated circuit die 10 is tested to determine if circuitry of the integrated circuit 10 is damaged. In the case of the LNA input terminal 20 in the example of FIGS. 1-3, the LNA circuit is determined to have been damaged by the discharge event if the gain of the LNA circuit is tested to be below a specified gain, or if when the LNA circuit is disabled the LNA circuit consumes an amount of current that exceeds a specified amount of leakage current. In the simplified ESD test scenario described here, the packaged integrated circuit is tested in this fashion using ever high magnitudes of electric fields until the integrated circuit exhibits ESD damage. The highest voltage at which this damage does not occur is referred to as the CDM rating voltage. If the CDM rating is adequately high, then it is determined that production run integrated circuits of the type tested will likely have adequate ESD protection circuitry and can be shipped to customers for incorporation into electronic products.

Figure 4:
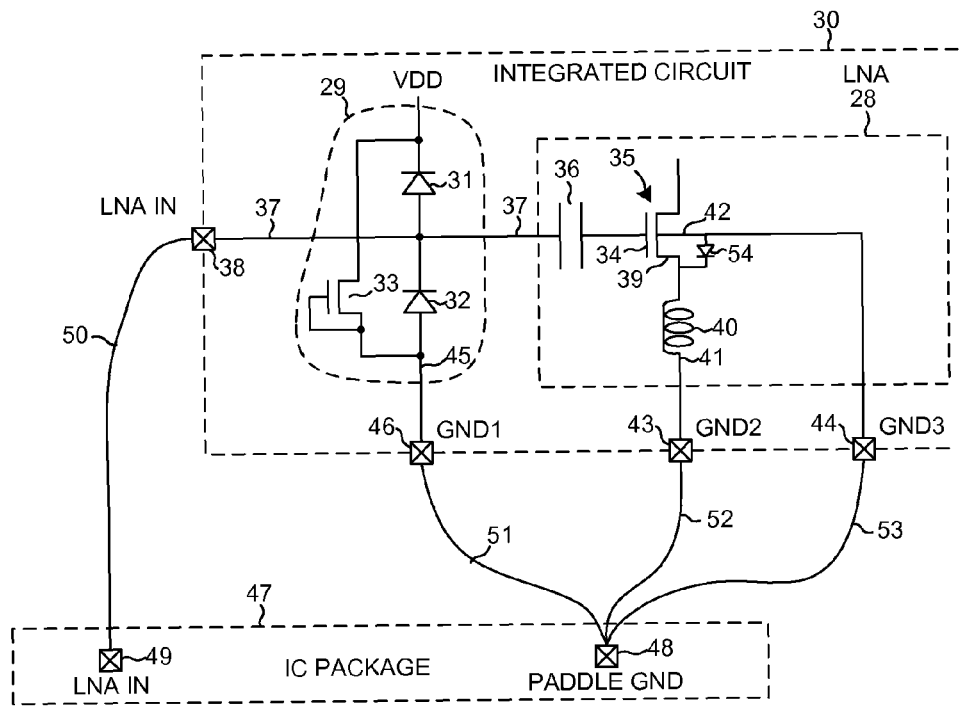
FIG. 4 is a simplified diagram of LNA input circuitry within one type of conventional integrated circuit used in cellular telephones.

FIG. 4 (Prior Art) is a simplified circuit diagram of a part of a conventional integrated circuit 30 involving a LNA circuit 28 and an ESD protection circuit 29. ESD protection circuit 29 includes diodes 31 and 32 and a clamp circuit 33. The gate 34 of a field effect transistor (FET) 35 is coupled via a capacitor 36 to an LNA input conductor 37 and to LNA IN input bond pad 38. The structure of FET 35 includes an inherent body-to-source PN junction 54. The source and drain of the N-channel FET 35 extend into a well of P-type semiconductor material, which in turn extends into a well of N-type semiconductor material, which in turn extends into a P-type semiconductor bulk substrate material. To improve LNA performance, the source 39 of FET 35 is degenerated using a degeneration inductor 40. An example of such an LNA is sometimes referred to as a derivative superposition (DS) LNA or a modified derivative superposition (MDS) LNA. In the design of LNA circuit 28, it is generally desired to keep sources of noise elsewhere in the integrated circuit from affecting the operation FET 35. There may, for example, be an amount of noise present in the substrate of integrated circuit 30. To help isolate this noise from the LNA, the second lead 41 of degeneration inductor 40 is not directly coupled to the substrate ground of the integrated circuit. The body 42 is connected to the substrate ground, so the second lead 41 of degeneration inductor 40 is not directed coupled to the body 39 of FET 35, rather the second lead 41 of degeneration inductor 40 and the body 42 of FET 35 are provided with separate ground bond pads 43 and 44, respectively. In addition, noise may be present on the ground node 45 of ESD protection circuit 29 and its associated conductors. Terminals 43 and 44 associated with FET 35 are therefore isolated from noisy node 45 by providing the ESD protection circuit with its own ground bond pad 46. Although not illustrated in FIG. 4, there are many identical ESD protection circuits that are grounded to node 45. Node 45 may be referred to as an ESD ground bus. Ground bond pad 46 grounds this ESD ground bus.

The dashed box 47 in FIG. 4 represents the package that contains integrated circuit die 30. Terminal symbols 48 and 49 represent the paddle ground terminal and the LNA input terminal of the package 47, respectively. The LNA IN bond pad 38 of integrated circuit 30 is coupled by a bond wire 50 to LNA IN terminal 49 of the package 47. The ground bond pads 46, 43, and 44 are coupled by bond wires 51-53 to paddle ground terminal 48, respectively.

Figure 5:
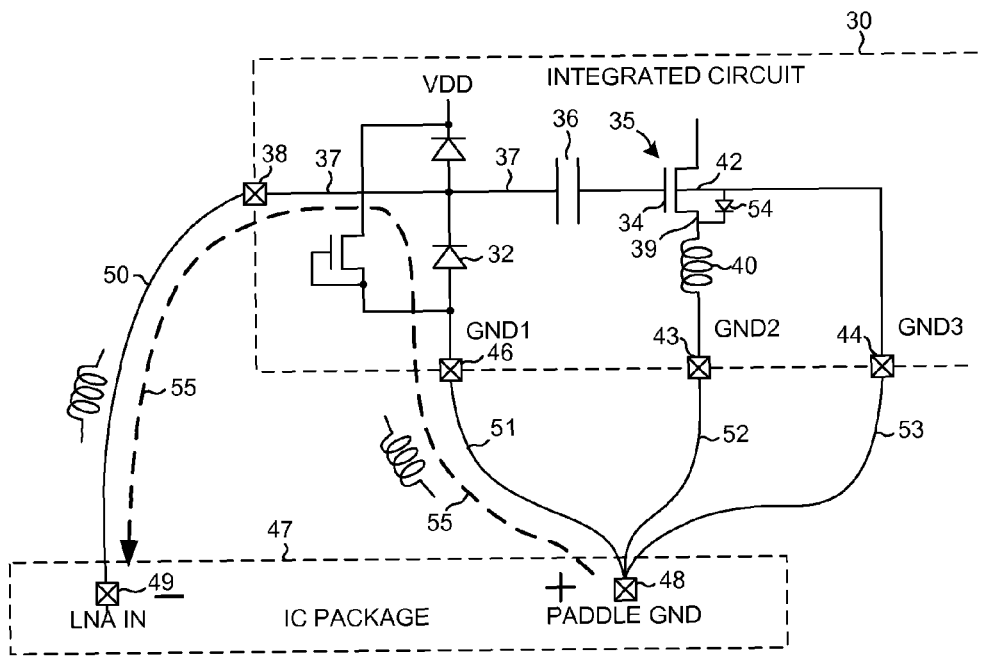
FIG. 5 illustrates an ESD failure mechanism attendant in the conventional integrated circuit of FIG. 4.

FIG. 5 illustrates operation of the conventional circuit of FIG. 4 during one example of an ESD event. In this example, all internal nodes and conductors of integrated circuit 30 are initially charged to a relatively high potential voltage. The "+" symbol represents this high voltage. The high voltage is therefore also initially present on paddle terminal 48 and on LNA IN terminal 49. Next, a large negative voltage is made to be present on LNA IN terminal 49. One example of how this might occur is due to the operation of ESD test equipment as explained above in connection with FIGS. 1-3. The "−" symbol represents this relative low voltage on LNA IN terminal 49. When the negative voltage first appears on LNA IN terminal 49 substantially no current flows through bond wires 52 and 53. The gate dielectric of FET 35 initially prevents the flow of current through the transistor and to conductor 37. The voltages on the body 42 of FET 35, the source 39 of FET 35, and the paddle ground terminal 48 remain the same at the voltage to which they were initially charged. Because the voltages on the body 42, source 39, and bond pads 43 and 44, and the paddle terminal 48 are the same, there is no or little current flow.

The relative low voltage on LNA IN terminal 49, however, causes diode 32 of ESD protection circuit 29 to be forward biased. A current 55 therefore flows from paddle ground terminal 48, through bond wire 51, through bond pad 46, through forward-biased diode 32, through LNA IN bond pad 38, through bond wire 50, and to LNA IN terminal 49. This current flow is indicated in FIG. 5 by the dashed line identified by reference numeral 55. If there is only a relatively small voltage drop across bond wire 51 during the flow of current 55, and the forward voltage drop across conductive diode 32 is small, then only a relatively small voltage will be present across the gate dielectric of FET 35. The circuit of FIG. 4 involving ESD protection circuit 29 has worked well in the protection of LNA input circuitry in conventional integrated circuits. In the recent past, however, as integrated circuits that include the LNA input circuitry have increased in size, failures of the LNA input FET 35 have been detected.

The bond wires of the packaged integrated circuit, including in particular the bond wire 51, may exhibit a substantial amount of inductance. As integrated circuits using the circuit of FIG. 4 have increased in size, so too has the capacitance that must be discharged through the LNA IN bond pad 38 during an ESD event. The result is a larger spike of current 55 than flowed in the past when the smaller integrated circuits that included the same LNA circuitry were tested. The spike of current 55 must flow across the inductance of bond wire 51 as illustrated in FIG. 5. Due to the V=LdI/dT relation that describes operation of the inductance of bond wire 51, the larger spike of current 55 through the inductance of bond wire 51 results in a larger voltage drop developing across the inductance of bond wire 51. During the spike of ESD current 55, the voltage on the GND1 bond pad 46 spikes downward with respect to the voltage on paddle ground terminal 48. ESD protection diode 32 is forward biased, so there is only a small forward bias voltage drop across diode 32 between the GND1 bond pad 46 and conductor 37. A large relative negative voltage therefore develops on the LNA IN conductor 37 during the ESD event with respect to the voltage on source 39 and body 42 to which these nodes were initially charged. The ESD current spike is a rapid event. The capacitor 36 in such a high frequency condition shorts the high voltage signal from LNA IN conductor 37 to the gate 34 of FET 35. As described above, little or no current initially flows through bond wires 52 and 53. Consequently, the voltage on the source 39 of FET 35 is substantially the same as the voltage on paddle terminal 48. Similarly, the voltage on body 42 of FET 35 is also substantially the same as the voltage on paddle terminal 48. Therefore, when the large spike of ESD current 55 is made to flow through the inductance of bond wire 51, a large voltage momentarily develops between the gate 34 of FET 35 and the source 39 and body 42 of the FET 35. This large voltage can cause FET 35 to be damaged in the conventional circuit of FIG. 4.

Figure 6:
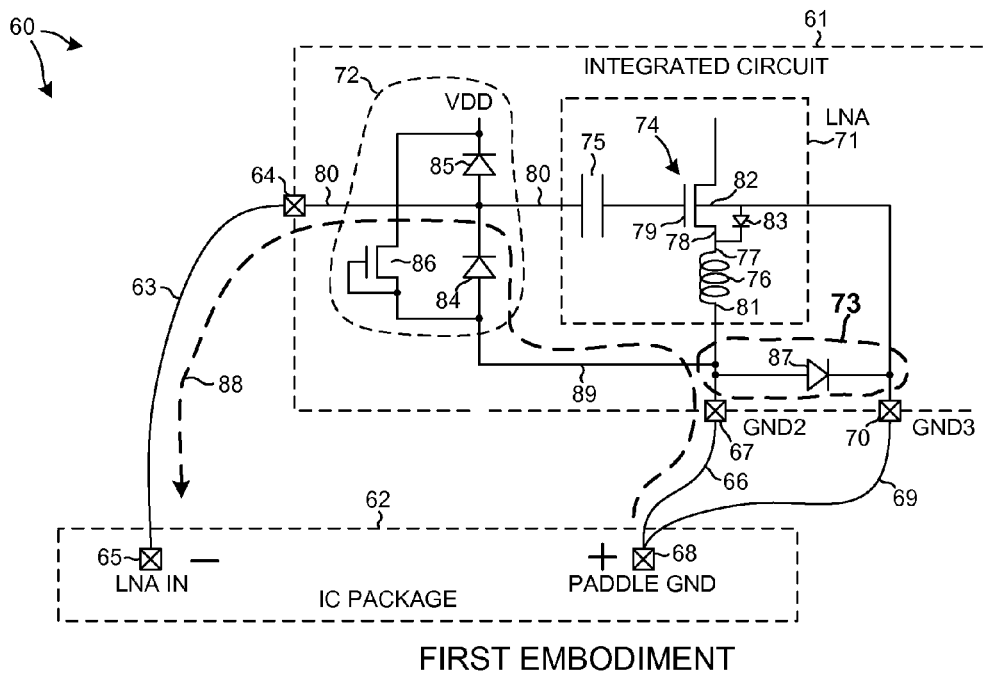
FIG. 6 is a circuit diagram of a first embodiment of a novel a packaged integrated circuit 60. The dashed line 88 represents an ESD current flow during an ESD event of a first polarity.

FIG. 6 is a circuit diagram of a first embodiment of a packaged integrated circuit 60. Packaged integrated circuit 60 includes an integrated circuit die 61 that is disposed in a package 62. A bond wire 63 couples an LNA input bond pad 64 to an LNA input terminal 65 of the package 62. Bond wire 66 couples GND2 bond pad 67 to paddle terminal 68 of the package 62. Bond wire 69 couples GND3 bond pad 70 to the paddle terminal 68. Integrated circuit die 61 includes an LNA circuit 71, a first ESD protection circuit 72, and a second ESD protection circuit 73. LNA circuit 71 includes, as well as other parts not illustrated, FET 74, capacitor 75, and a degeneration inductor 76. A first lead 77 of degeneration inductor 76 is coupled to the source 78 of FET 74 as illustrated. The gate 79 of FET 74 is capacitively coupled via capacitor 75 to LNA IN conductor 80 and to LNA IN bond pad 64. The second lead 81 of degeneration inductor 76 is coupled to bond pad 67. The body 82 of FET 74 is coupled to bond pad 70. FET 74 is an N-channel FET fabricated using a triple-well semiconductor fabrication process. The source and drain regions of FET 74 extend into a well of P-type semiconductor material, which in turn extends into a well of N-type semiconductor material, which in turn extends into a P-type semiconductor bulk substrate material. An inherent PN junction 83 exists between the body 82 (i.e. the Pwell into which the N-type source and drain regions of FET 74 extend) and the source 78 of FET 74. First ESD protection circuit 72 includes a first diode 84, a second diode 85, and a clamp circuit 86 that are connected as illustrated in FIG. 6. Novel second ESD protection circuit 73 includes diode 87. The anode of diode 87 is coupled to GND2 bond pad 67 whereas the cathode is coupled to the body 82 of FET 74 and to GND3 bond pad 70. In some applications, diode 87 can be sized to cancel amplifier non-linearity due to the non-linearity of the inherent PN junction 83.

An operation of the first embodiment of FIG. 6 is now described. (The explanation of this operation that follows, as well as the other descriptions of circuit operations in this patent document are simplifications and may be inaccurate in certain respects. For more accurate information on circuit operation, the actual circuit being considered can be modeled and simulated using a circuit simulator such as SPICE.) Initially, assume that all capacitances of integrated circuit 61 are at a first potential. The "+" symbol represents this first potential. Then during an ESD event the voltage on LNA input terminal 65 is made to spike to a relative negative voltage. A spike of ESD current 88 is made to flow from paddle ground terminal 68, through the inductance of bond wire 66, through GND2 bond pad 67, through conductor 89, through forward-biased diode 84, through LNA input conductor 80, through LNA input bond pad 64, through bond wire 63, and to LNA input terminal 65. The large ESD current flow across bond wire 66 may cause the voltage on bond pad GND2 67 to drop to a much more negative voltage than is present on paddle terminal 68. Due to the operation of diode 84, the voltage on conductor 80 is roughly the same as the voltage on bond pad GND2 67. Under the high frequency switching situation, capacitor 75 couples the negative voltage on conductor 80 to the gate of FET 74. The voltage on the gate of FET 74 therefore spikes downward.

In the circuit of FIG. 6, the second lead 81 of degeneration inductor 76 is coupled to the bond pad GND2 whose voltage spikes downward during the ESD event. When the voltage on bond pad GND2 spikes downward, some current flows through degeneration inductor 76 from the source 78 of FET 74 to the GND2 bond pad 67. Due to this current flow, there is some voltage drop across degeneration inductor 76 but this voltage drop is smaller than the voltage drop across bond wire 66. The voltage on source 78 of FET 74 is therefore reduced, which in turn helps reduce the magnitude of the voltage difference between source 78 and gate 79. As the voltage on source 78 decreases, PN junction 83 maintains the voltage on body 82 at a voltage that is not more than one forward bias voltage drop above the voltage on source 78. Accordingly, the voltage on body 82 therefore tracks the voltage on the source downward during the ESD event, thereby reducing the magnitude of the voltage difference between body 82 and gate 79.

Figure 7:
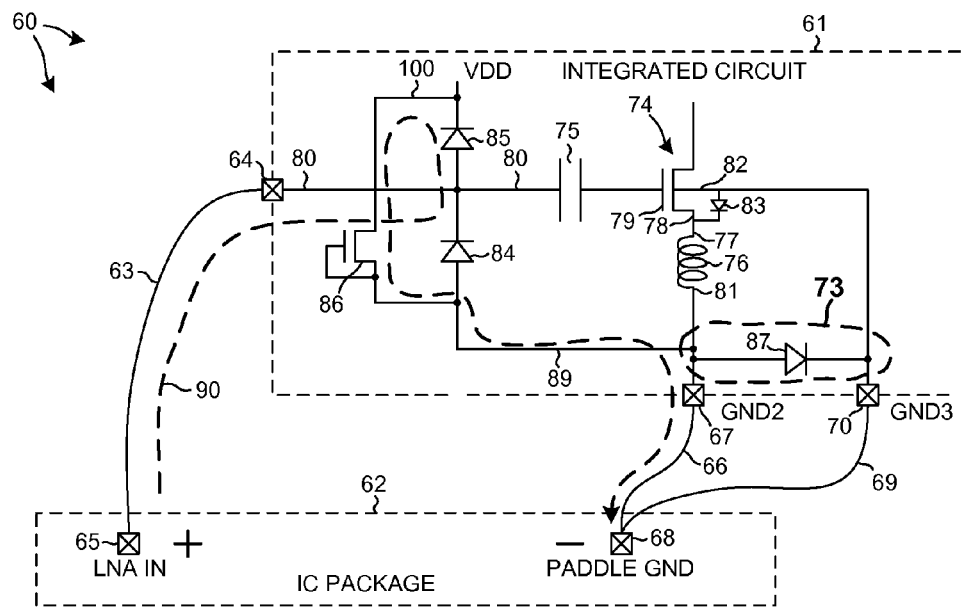
FIG. 7 is a circuit diagram of the first embodiment of FIG. 6 during an ESD event of a second polarity opposite the first polarity.

FIG. 7 illustrates operation of the novel circuit of FIG. 6 in a condition in which an opposite ESD polarity event occurs. Initially, the capacitances of all nodes of integrated circuit 61 are charged to a substantially equal voltage. This voltage is indicated in FIG. 7 with the "−" symbol. The body 82 of FET 74 as well as the source 78 and the gate 79 of FET 74 are all charged to this voltage. Next, a large positive voltage is made to appear on the LNA IN terminal 65. An ESD current 90 flows from LNA IN terminal 65, through bond wire 63, through LNA IN bond pad 64, to conductor 80, through diode 85 to VDD supply node 100, then through clamp circuit 86, to conductor 89, through GND2 bond pad 67, through bond wire 66, and to paddle terminal 68. If the voltage on conductor 89 exceeds more than one forward-bias diode drop with respect to the voltage on body 82 of FET 74, then ESD protection diode 87 of the second ESD circuit 73 becomes forward biased and conductive, thereby effectively clamping the voltage on body 82 of FET 74 to be not more than one forward-bias diode drop lower than the voltage of bond pad GND2 67. Accordingly, as the voltage on the gate 79 spikes upward during the ESD event, the voltage on the body 82 also spikes upward, thereby protecting the gate dielectric of FET 74. PN junction 83 prevents the voltage on the body 82 from exceeding the voltage on source 78 by more than one diode forward bias voltage drop. The voltage on source 78 therefore also tracks the increasing voltage on the gate 79 and protects the date dielectric of FET 74.

If diode 87 were not present, then the voltage on the gate of FET 74 might rise to have a much more positive voltage than is present on the body 82 of FET 74. During the flow of ESD current through bond wire 66, there would be substantially no current flow through bond wire 69. Consequently the initial voltage to which the body 82 of FET 74 was charged would remain on body 82 of FET 74 despite the fact that the voltage on the gate 79 of FET 74 spikes positive. In the novel circuit of FIGS. 6 and 7, however, diode 87 becomes forward biased as bond pad GND2 67 begins to increase in voltage with respect to bond pad GND3 70, thereby causing the voltage on body 82 and source 78 of FET 74 to increase along with the increasing voltage on the gate 79 of FET 74, thereby protecting FET 74.

Figure 8:
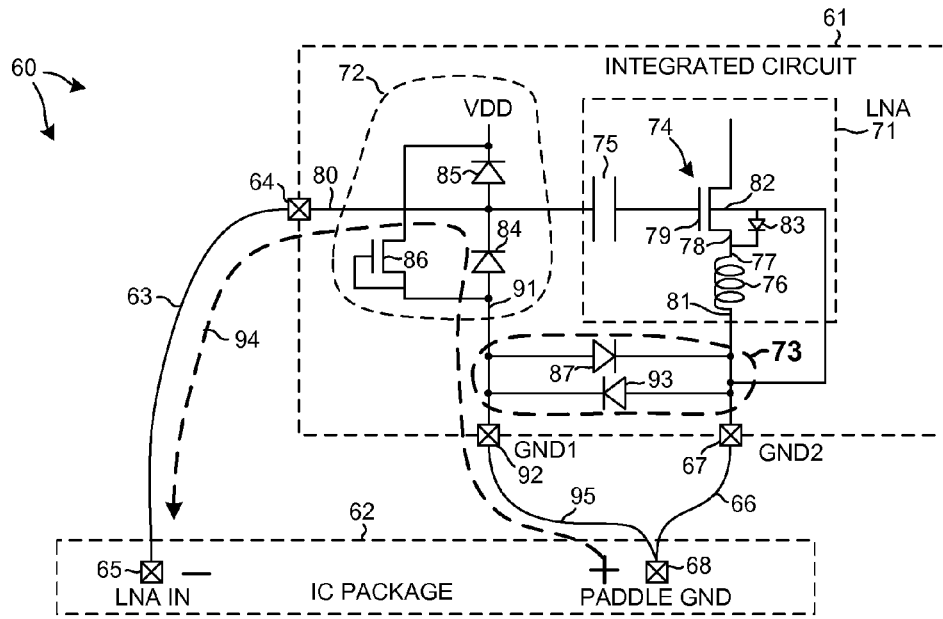
FIG. 8 is a circuit diagram of a second embodiment of novel packaged integrated circuit 60. The dashed line 94 represents an ESD current flow during an ESD event of a first polarity.

FIG. 8 is a circuit diagram of a second embodiment. In the second embodiment, ground node 91 of first ESD protection circuit 72 is not directly connected on integrated circuit 61 to the ground pad GND2 that grounds LNA circuit 71. Rather, a separate ground pad GND1 92 is provided. GND1 ground pad 92 is directly connected on integrated circuit 61 to ground node 91 of first ESD protection circuit 72. The second ESD protection circuit 73 includes first diode 87 and a second diode 93. First diode 87 is connected as illustrated in FIG. 8 so that it can conduct a second ESD current from ground node 91 and GND1 ground pad 92 to body 82 and GND2 bond pad 67. Second diode 93 is connected as shown in back-to-back relation with respect to first diode 87. The anode of second diode 93 is coupled to GND2 bond pad 67 and the cathode of second diode 93 is coupled to GND1 bond pad 92. If the voltage on GND1 bond pad 92 falls more than one forward bias voltage drop below the voltage on GND2 bond pad 67, then second diode 93 conducts current and causes the voltage on the GND2 bond pad 67 to drop and track the decreasing voltage on GND1 bond pad 92. Back-to-back diodes 87 and 93 of the second ESD protection circuit work to keep the voltages on bond pads GND1 and GND2 within one forward bias diode drop of one another. Due to the fact that LNA circuit 71 is not grounded to the same ground node 91 that the first ESD protection circuit 72 is grounded, the second embodiment of FIG. 8 allows LNA circuit 71 to be isolated from noise from first ESD protection circuit 72 and its associated conductors.

In operation, assume that all capacitances of integrated circuit 61 are initially at a first potential as described above in connection with FIG. 6. Then during an ESD event the voltage on LNA input terminal 65 is made to spike to a large relative negative voltage. A spike of ESD current 94 is results. This current 94 flows from paddle ground terminal 68, through the inductance of bond wire 95, through GND1 bond pad 92, to ground node 91, through forward-biased diode 84, through LNA input conductor 80, through LNA input bond pad 64, through bond wire 63, and to LNA input terminal 65. The large ESD current flow across bond wire 95 causes the voltage on bond pad GND1 92 to drop to a negative voltage with respect to the voltage on paddle terminal 68, and this negative voltage is communicated through forward biased diode 84 and capacitor 75 onto the gate 79 of FET 74 as described above in connection with FIG. 6. The large negative voltage on gate 79 of FET 74 is not, however, present across the gate dielectric of FET 74 due to diode 93. Diode 93 prevents the voltage on the ground of LNA circuit 71 at ground pad 67 from being more than one forward biased voltage drop higher than the voltage on ground node 91. If the voltage on gate 79 of FET 74 spikes downward during an ESD event, then the voltage on the body 82 of FET 74 is also pulled down due to conduction of diode 93. The decrease in the voltage on GND2 bond pad 67 causes an increased voltage across degeneration inductor 76 which is turn causes a current to flow through degeneration inductor 76. This current helps discharge the source 78 of FET 74 to some degree, and reduces the voltage on source 78, thereby preventing a large source-to-gate voltage from developing on FET 74.

Figure 9:
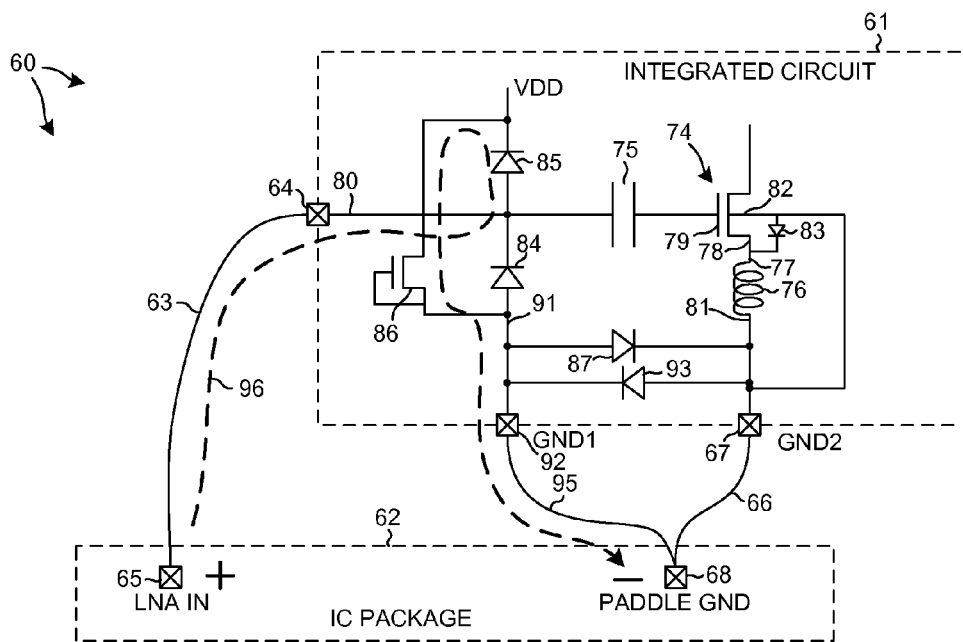
FIG. 9 is a circuit diagram of the second embodiment of FIG. 8 during an ESD event of a second polarity opposite the first polarity.

FIG. 9 illustrates operation of the circuit of FIG. 8 in a condition in which an opposite ESD polarity event occurs. Initially, the capacitances of all nodes of integrated circuit 61 are charged to a substantially equal voltage. The voltage on LNA IN terminal 65 is then made to spike to a relative high voltage. This high voltage with respect to the voltage on paddle ground terminal 68 is represented in FIG. 9 by the "+" symbol. Dashed line 96 represents the resulting flow of ESD current. The flow of current 96 flows across the inductance of bond wire 95 and causes the voltage on GND1 bond pad 92 to spike to a high voltage relative to the voltage on paddle ground terminal 68. Due to the relatively low voltage drops across clamp 86 and diode 85, and the AC coupling of capacitor 75, most of the voltage of this spike of high voltage is communicated onto the gate 79 of FET 74. This spike of high voltage relative to the voltage of paddle ground terminal 68 does not, however, result in a large voltage across the gate dielectric of FET 74 due to the operation of diode 87. Diode 87 prevents the voltage on the ground of LNA circuit 71 at ground pad 67 from being more than one forward biased voltage drop lower than the voltage on ground node 91. Accordingly, when the voltage on ground node 91 spikes upward during the ESD event and reaches one forward bias diode drop above the voltage on GND2 bond pad 67, then diode 87 conducts. Conduction of diode 87 causes the voltage on the ground of LNA circuit 71 and the body 82 of FET 74 to rise and track the rising voltage on ground node 91. Accordingly, the voltage on the body 82 of FET increases and the gate-to-body voltage on FET 74 is kept from reaching high levels that would damage FET 74. PN junction 83 ensures that the voltage on the source 78 is not more than about one forward bias voltage drop lower than the voltage on the body 82. The voltage on source 78 therefore tracks the voltage on body 82 as the voltage on body 82 rise. The voltages on the body 82 and the source 78 rise and track the voltage on gate 79 in this fashion such that high gate-to-body and high gate-to-source voltages do not develop on FET 74.

Figure 10:
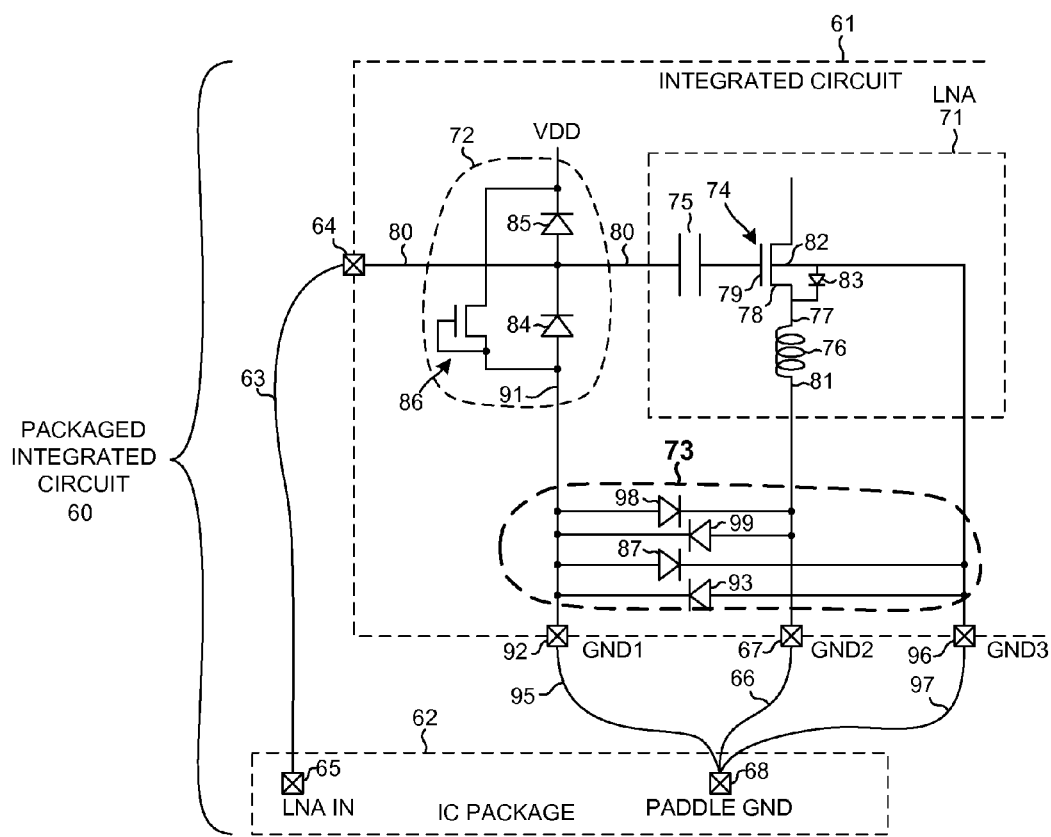
FIG. 10 is a circuit diagram of a third embodiment of novel packaged integrated circuit 60.

FIG. 10 is a circuit diagram of a third embodiment. In the third embodiment, the ground of LNA circuit 71 at the second lead 81 of degeneration inductor 76 is not directly connected to the substrate at body 82 of FET 74. Rather, the body 82 is provided with its own GND3 bond pad 96. GND3 ground bond pad 96 is connected by its own wire bond 97 to paddle ground terminal 68. This additional ground bond pad GND3 and wire bond may help reduce the effect that substrate noise has on the operation of FET 74 by isolating the substrate from the source 78 of FET 74. The back-to-back connected diodes 87 and 93 are connected between the GND1 bond pad 92 and the GND3 bond pad 96. As explained above in connection with FIG. 8, back-to-back connected diodes 87 and 93 prevent the voltage on body 82 from being more than one forward bias voltage drop above or below the voltage on GND1 bond pad 92. Accordingly, in an ESD event if the voltage on GND1 bond pad 92 drops as explained above in connection with FIG. 8, then diode 93 will conduct if the voltage on GND1 bond pad 92 falls more than one forward bias voltage drop below the voltage on GND3 bond pad 96. The result of the conducting of diode 93 is that the voltage on body 82 is decreased to keep the voltage on body 82 within one forward bias voltage drop of the voltage on GND1 bond pad 92. Similarly, in an ESD event if the voltage on GND1 bond pad 92 increases as explained above in connection with FIG. 9, then diode 87 will conduct if the voltage on GND1 bond pad 92 rises more than one forward bias voltage drop above the voltage on GND3 bond pad 96. The result of the conducting of diode 87 is that the voltage on body 82 is increased to keep the voltage on body 82 within one forward bias voltage drop of the voltage on GND1 bond pad 92.

In addition to diodes 87 and 93, the second ESD protection circuit 73 of the third embodiment of FIG. 10 includes a second pair of back-to-back connected diodes 98 and 99. This second pair of diodes 98 and 99 is connected between GND1 bond pad 92 and the ground bond pad 67 of the LNA circuit 71. The back-to-back connected diodes 98 and 99 prevent the voltage on the GND2 bond pad 67 from differing by more than one forward bias diode drop from the voltage on GND1 bond pad 92 during an ESD event. The voltages of both the GND2 and GND3 bond pads are therefore prevented from differing by more than approximately one forward bias diode voltage drop from the voltage on GND1 bond pad 92. This helps prevent large gate-to-source and gate-to-body voltages from developing and damaging FET 74.

Figure 11:
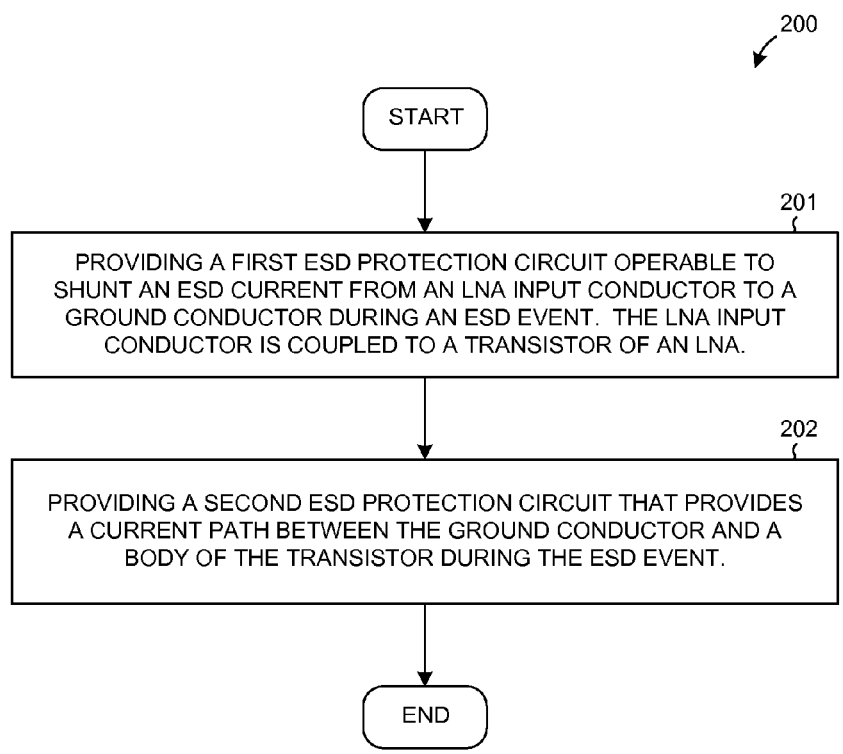
FIG. 11 is a flowchart of a novel method 200.

FIG. 11 is a flowchart of a method 200 in accordance with one novel aspect. A first ESD protection circuit is provided (step 201) that is capable of shunting an ESD current from an LNA input conductor to a ground conductor during an ESD event. In one example of the method, the first ESD protection circuit is first ESD protection circuit 72 of FIGS. 6 and 7 and the ground conductor is conductor 89 and bond pad 67 of FIGS. 6 and 7. A second ESD protection circuit is provided (step 202) that provides a current path between the ground conductor and a body of the transistor of the LNA during the ESD event. In one example of the method, the current path is the path of a current that flows in the situation depicted in FIG. 7 through diode 87 from conductor 89 and bond pad 67 to the body 82 of transistor 74 of LNA 71.

Although certain specific embodiments are described above for instructional purposes, the teachings of this patent document have general applicability and are not limited to the specific embodiments described above. Although the descriptions of the three embodiments above involve injection molded wire bond packages involving ground wire bond pads and bond wires, the three embodiments need not involve injection molded wire bond packages. For example, in the illustrations of the three embodiments, the bond pad symbol may represent a flip-chip microbump that is flip-chip mounted to a package that contains the integrated circuit die. The lines in the illustrations of the three embodiments that represent wire bonds may, in a flip-chip example, represent electrical connections between flip-chip microbumps on the integrated circuit die and terminals on the package. The terminals are terminals usable to connect the packaged integrated circuit to a printed circuit board. Although a single diode is illustrated as the control element of the second ESD protection circuit 73 that passes current during an ESD event, the illustrated single diode is just one example. In another example, two series connected diodes are used in the place of selected ones of the single diodes of the second ESD protection circuits illustrated in FIGS. 6-10. Other circuit components and combinations of circuit components may be used to realize the second ESD protection circuit including diode-connected transistors. Although embodiments are described above in which the analog circuit is a LNA, this is but one example of an analog circuit whose input transistor can be protected using the second ESD protection circuit and techniques disclosed in this patent document. Accordingly, various modifications, adaptations, and combinations of the various features of the described specific embodiments can be practiced without departing from the scope of the claims that are set forth below.

What is claimed is:

1. An integrated circuit comprising:
an analog signal input conductor;
a first ground conductor;
a first electrostatic discharge (ESD) protection circuit coupled to conduct a first ESD current between the first ground conductor and the analog signal input conductor;
a transistor having a gate, a source, a drain, and a body, wherein the gate is coupled to receive an analog signal from the analog signal input conductor;
a degeneration inductor having a first lead and a second lead, wherein the first lead is coupled to the source of the transistor; and
a second ESD protection circuit coupled to conduct a second ESD current between the first ground conductor and the body of the transistor;
wherein the second ESD protection circuit includes a diode having an anode coupled to the first ground conductor and having a cathode coupled to the body of the transistor, wherein the second ESD protection circuit further comprises a second diode, the second diode having a cathode coupled to the first ground conductor and having an anode coupled to the second lead of the degeneration inductor.

2. The integrated circuit of claim 1, wherein the first ground conductor and the second lead of the degeneration inductor are a single node, and wherein the second ESD protection circuit includes a diode having an anode coupled to the second lead of the degeneration inductor and having a cathode coupled to the body of the transistor.

3. The integrated circuit of claim 1, wherein the body of the transistor and the second lead of the degeneration inductor are a single node, and wherein the second ESD protection circuit includes a diode having an anode coupled to the first ground conductor and having a cathode coupled to the second lead of the degeneration inductor.

4. The integrated circuit of claim 1, wherein the second ESD protection circuit includes a first diode having an anode coupled to the first ground conductor and having a cathode coupled to a second ground conductor, wherein the second ground conductor is coupled to the body of the transistor, and wherein the second ESD protection circuit further includes a second diode having an anode coupled to the first ground conductor and having a cathode coupled to the second lead of the degeneration inductor.

5. The integrated circuit of claim 1, wherein the analog signal input conductor is an analog signal input terminal of the integrated circuit, and wherein the first ground conductor is a ground terminal of the integrated circuit.

6. The integrated circuit of claim 1, wherein the transistor and the degeneration inductor are parts of a low noise amplifier (LNA) circuit.

7. The integrated circuit of claim 1, wherein the gate of the transistor is directly coupled to the analog signal input conductor without an intervening capacitor.

8. The integrated circuit of claim 1, wherein the gate of the transistor is capacitively coupled to the analog signal input conductor via a capacitor.

9. The integrated circuit of claim 1, wherein the analog signal input conductor includes a structure taken from the group consisting of: a flip-chip microbump, and a wire bond pad.

10. The integrated circuit of claim 1, wherein the analog signal input conductor is coupled to a bond wire.

11. The integrated circuit of claim 1, wherein the first ESD protection circuit includes a diode, wherein an anode of the diode of the first ESD protection circuit is coupled to the first ground conductor, and wherein a cathode of the diode of the first ESD protection circuit is coupled to the analog signal input conductor.

12. A method comprising:
(a) providing a first electrostatic discharge (ESD) protection circuit operable to shunt an ESD current from a Low Noise Amplifier (LNA) input conductor to a ground conductor during an ESD event; and
(b) providing a second ESD protection circuit that provides a current path between the ground conductor and a body of a transistor of the LNA during the ESD event, wherein the ground conductor, the first ESD protection circuit, the second ESD protection circuit and the LNA are parts of a single integrated circuit;
wherein the ground conductor includes a first structure taken from a group consisting of a flip-chip microbump and a wire bond pad, and wherein the body of the transistor is coupled to a second structure taken from the group consisting of a flip-chip microbump and a wire bond pad;
wherein the second ESD protection circuit includes a first diode and a second diode, the first diode having an anode coupled to the first structure and a cathode coupled to the second structure, the second diode having an anode coupled to the second structure and having a cathode coupled to the first structure.

13. The method of claim 12, wherein the ground conductor includes a structure taken from a group consisting of a flip-chip microbump and a wire bond pad, and wherein the second ESD protection circuit is a diode having an anode coupled to the ground conductor and having a cathode coupled to the body of the transistor.

14. The method of claim 12, wherein the ground conductor includes a first structure taken from a group consisting of a flip-chip microbump and a wire bond pad, wherein a generation inductor of the LNA is coupled to a second structure taken from the group consisting of a flip-chip microbump and a wire bond pad, wherein the body of the transistor is coupled to a third structure taken from the group consisting of a flip-chip microbump and a wire bond pad, and wherein the first, second and third structures are parts of the single integrated circuit.

15. The method of claim 14, wherein the second ESD protection circuit includes a first diode and a second diode, the first diode having an anode coupled to the first structure and a cathode coupled to the third structure, the second diode having an anode coupled to the third structure and having a cathode coupled to the first structure.

16. An integrated circuit comprising:
an analog signal input conductor;
a ground conductor;
a first electrostatic discharge (ESD) protection circuit adapted to conduct an ESD current during an ESD event between the analog signal input conductor and the ground conductor; and
means for conducting a current between a body of a transistor of a Low Noise Amplifier (LNA) and the ground conductor during the ESD event such that a voltage on the body of the transistor is changed to prevent a damaging gate-to-body voltage from developing across the transistor during the ESD event, wherein a gate of the transistor is coupled to the analog signal input conductor, and wherein the analog signal input conductor, the ground conductor, the first ESD protection circuit, the LNA, and the means are all parts of the integrated circuit;
a second ESD protection circuit which includes a first diode and a second diode, the first diode having an anode coupled to the ground conductor and a cathode coupled to the body of the transistor, the second diode having an anode coupled to the body of the transistor and having a cathode coupled to the ground conductor.

17. The integrated circuit of claim 16, wherein the first ESD protection circuit conducts the ESD current during the ESD event from the ground conductor to the analog signal input conductor.

18. The integrated circuit of claim 17, wherein the analog signal input conductor is a first structure taken from a group consisting of a flip-chip microbump and a wire bond pad, and wherein the ground conductor is a second structure taken from the group consisting of a flip-chip microbump and a wire bond pad.

* * * * *